US011164934B2

(12) United States Patent
Bower et al.

(10) Patent No.: US 11,164,934 B2
(45) Date of Patent: Nov. 2, 2021

(54) TILED DISPLAYS WITH BLACK-MATRIX SUPPORT SCREENS

(71) Applicant: X Display Company Technology Limited, Dublin (IE)

(72) Inventors: Christopher Andrew Bower, Raleigh, NC (US); Matthew Alexander Meitl, Durham, NC (US); Erich Radauscher, Raleigh, NC (US); Ronald S. Cok, Rochester, NY (US)

(73) Assignee: X Display Company Technology Limited, Dublin (IE)

( * ) Notice: Subject to any disclaimer, the term of this patent is extended or adjusted under 35 U.S.C. 154(b) by 0 days.

(21) Appl. No.: 16/808,348

(22) Filed: Mar. 3, 2020

(65) Prior Publication Data

US 2020/0295120 A1    Sep. 17, 2020

Related U.S. Application Data

(60) Provisional application No. 62/817,478, filed on Mar. 12, 2019.

(51) Int. Cl.
*H01L 27/32* (2006.01)
*G06F 3/147* (2006.01)
(Continued)

(52) U.S. Cl.
CPC .......... *H01L 27/3293* (2013.01); *G06F 3/147* (2013.01); *G06F 3/1446* (2013.01);
(Continued)

(58) Field of Classification Search
CPC ............... G06F 3/1446; G06F 3/147; H01L 2251/5338; H01L 27/3276; H01L 27/3293;
(Continued)

(56) References Cited

U.S. PATENT DOCUMENTS 4,591,659 A      5/1986   Leibowitz
5,523,769 A  *   6/1996   Lauer .................... G06F 3/1446
                                                              345/1.3
(Continued)

FOREIGN PATENT DOCUMENTS

EP       1237141 A2 *   9/2002   ......... H01L 27/3293
EP       1548571 A1     6/2005
(Continued)

OTHER PUBLICATIONS

Bower, C. A. et al., Emissive displays with transfer-printed assemblies of 8 μm × 15 μm inorganic light-emitting diodes, Photonics Research, 5(2):A23-A29, (2017).
(Continued)

*Primary Examiner* — Dmitriy Bolotin
(74) *Attorney, Agent, or Firm* — Choate, Hall & Stewart LLP; William R. Haulbrook; Michael D. Schmitt

(57) ABSTRACT

A tiled display structure comprises a screen support having a screen emitter side and an opposing screen back side. A black matrix comprises a patterned layer of black-matrix material disposed on the screen back side, the pattern defining pixel openings that are substantially devoid of black-matrix material. An array of tiles comprises tiles each having a tile substrate and a plurality of pixels disposed in or on the tile substrate. Each pixel comprises one or more light emitters. The one or more light emitters are each disposed to emit light through a pixel opening in the black matrix. A substantially transparent adhesive layer adheres the array of tiles to the black-matrix material.

20 Claims, 19 Drawing Sheets

(51) Int. Cl.
*H01L 51/52* (2006.01)
*G06F 3/14* (2006.01)
(52) U.S. Cl.
CPC ...... *H01L 27/3276* (2013.01); *H01L 51/5284* (2013.01); *H01L 2251/5338* (2013.01)
(58) Field of Classification Search
CPC .......... H01L 51/5284; G09G 2300/026; G02F 1/13336
USPC ........................................................ 345/1.3
See application file for complete search history.

(56) References Cited

U.S. PATENT DOCUMENTS

| | | | |
|---|---|---|---|
| 5,563,470 A | 10/1996 | Li | |
| 5,686,790 A | 11/1997 | Curtin et al. | |
| 5,739,800 A | 4/1998 | Lebby et al. | |
| 5,838,405 A * | 11/1998 | Izumi | G02F 1/1339 349/73 |
| 5,986,622 A * | 11/1999 | Ong | G06F 3/1446 345/1.1 |
| 6,142,358 A | 11/2000 | Cohn et al. | |
| 6,476,783 B2 * | 11/2002 | Matthies | G02F 1/13336 345/82 |
| 6,498,592 B1 * | 12/2002 | Matthies | G02F 1/13336 257/E25.032 |
| 6,501,441 B1 * | 12/2002 | Ludtke | G09G 5/14 345/1.1 |
| 6,593,902 B1 * | 7/2003 | Ogino | G09G 3/20 345/55 |
| 6,624,570 B1 * | 9/2003 | Nishio | H01J 1/72 313/498 |
| 6,683,665 B1 * | 1/2004 | Matthies | G02F 1/1309 349/187 |
| 6,853,411 B2 | 2/2005 | Freidhoff et al. | |
| 6,870,519 B2 * | 3/2005 | Sundahl | G02F 1/13336 313/500 |
| 6,897,855 B1 * | 5/2005 | Matthies | H01L 25/167 345/204 |
| 7,195,733 B2 | 3/2007 | Rogers et al. | |
| 7,239,367 B2 | 7/2007 | Jin et al. | |
| 7,354,801 B2 | 4/2008 | Sugiyama et al. | |
| 7,394,194 B2 | 7/2008 | Cok | |
| 7,521,292 B2 | 4/2009 | Rogers et al. | |
| 7,557,367 B2 | 7/2009 | Rogers et al. | |
| 7,662,545 B2 | 2/2010 | Nuzzo et al. | |
| 7,704,684 B2 | 4/2010 | Rogers et al. | |
| 7,719,480 B2 * | 5/2010 | Devos | G06F 3/1446 345/1.3 |
| 7,799,699 B2 | 9/2010 | Nuzzo et al. | |
| 7,932,123 B2 | 4/2011 | Rogers et al. | |
| 7,943,491 B2 | 5/2011 | Nuzzo et al. | |
| 7,948,450 B2 * | 5/2011 | Kay | G06F 1/1601 345/1.3 |
| 7,972,875 B2 | 7/2011 | Rogers et al. | |
| 8,232,718 B2 * | 7/2012 | Cok | H01L 27/3293 313/504 |
| 8,333,860 B1 | 12/2012 | Bibl et al. | |
| 8,470,701 B2 | 6/2013 | Rogers et al. | |
| 8,531,642 B2 | 9/2013 | Kiryuschev et al. | |
| 8,558,243 B2 | 10/2013 | Bibl et al. | |
| 8,722,458 B2 | 5/2014 | Rogers et al. | |
| 8,791,474 B1 | 7/2014 | Bibl et al. | |
| 8,794,501 B2 | 8/2014 | Bibl et al. | |
| 8,835,940 B2 | 9/2014 | Hu et al. | |
| 8,865,489 B2 | 10/2014 | Rogers et al. | |
| 8,877,648 B2 | 11/2014 | Bower et al. | |
| 8,889,485 B2 | 11/2014 | Bower | |
| 8,934,259 B2 | 1/2015 | Bower et al. | |
| 8,941,215 B2 | 1/2015 | Hu et al. | |
| 8,987,765 B2 | 3/2015 | Bibl et al. | |
| 9,049,797 B2 | 6/2015 | Menard et al. | |
| 9,087,764 B2 | 7/2015 | Chan et al. | |
| 9,105,714 B2 | 8/2015 | Hu et al. | |
| 9,111,464 B2 | 8/2015 | Bibl et al. | |
| 9,139,425 B2 | 9/2015 | Vestyck | |
| 9,153,171 B2 | 10/2015 | Sakariya et al. | |
| 9,161,448 B2 | 10/2015 | Menard et al. | |
| 9,164,722 B2 * | 10/2015 | Hall | H05K 5/04 |
| 9,165,989 B2 | 10/2015 | Bower et al. | |
| 9,166,114 B2 | 10/2015 | Hu et al. | |
| 9,178,123 B2 | 11/2015 | Sakariya et al. | |
| 9,207,904 B2 * | 12/2015 | Hall | H01B 7/2825 |
| 9,217,541 B2 | 12/2015 | Bathurst et al. | |
| 9,240,397 B2 | 1/2016 | Bibl et al. | |
| 9,252,375 B2 | 2/2016 | Bibl et al. | |
| 9,355,854 B2 | 5/2016 | Meitl et al. | |
| 9,358,775 B2 | 6/2016 | Bower et al. | |
| 9,367,094 B2 | 6/2016 | Bibl et al. | |
| 9,412,727 B2 | 8/2016 | Menard et al. | |
| 9,414,503 B2 * | 8/2016 | Lee | H05K 5/0017 |
| 9,478,583 B2 | 10/2016 | Hu et al. | |
| 9,484,504 B2 | 11/2016 | Bibl et al. | |
| 9,520,537 B2 | 12/2016 | Bower et al. | |
| 9,555,644 B2 | 1/2017 | Rogers et al. | |
| 9,583,533 B2 | 2/2017 | Hu et al. | |
| 9,589,944 B2 | 3/2017 | Higginson et al. | |
| 9,601,356 B2 | 3/2017 | Bower et al. | |
| 9,640,715 B2 | 5/2017 | Bower et al. | |
| 9,716,082 B2 | 7/2017 | Bower et al. | |
| 9,741,785 B2 | 8/2017 | Bower et al. | |
| 9,761,754 B2 | 9/2017 | Bower et al. | |
| 9,765,934 B2 | 9/2017 | Rogers et al. | |
| 9,818,725 B2 | 11/2017 | Bower et al. | |
| 9,865,832 B2 | 1/2018 | Bibl et al. | |
| 9,929,053 B2 | 3/2018 | Bower et al. | |
| 9,934,759 B1 * | 4/2018 | Cross | G09G 5/14 |
| 10,061,553 B2 * | 8/2018 | Hall | G06F 3/1446 |
| 10,790,173 B2 * | 9/2020 | Gomez | H01L 23/13 |
| 2002/0050958 A1 * | 5/2002 | Matthies | H01L 25/167 345/55 |
| 2002/0051106 A1 * | 5/2002 | Nagashima | G02F 1/133512 349/110 |
| 2002/0140629 A1 * | 10/2002 | Sundahl | G02F 1/13336 345/1.3 |
| 2002/0163301 A1 * | 11/2002 | Morley | G02F 1/13336 313/506 |
| 2003/0025864 A1 * | 2/2003 | Chida | G02F 1/133788 349/124 |
| 2003/0141570 A1 | 7/2003 | Chen et al. | |
| 2005/0134526 A1 * | 6/2005 | Willem | G06F 3/147 345/1.3 |
| 2005/0140569 A1 * | 6/2005 | Sundahl | G09F 9/3026 345/1.3 |
| 2006/0001796 A1 * | 1/2006 | Chang | G02F 1/133526 349/95 |
| 2006/0012733 A1 * | 1/2006 | Jin | G02F 1/13336 349/73 |
| 2009/0033856 A1 * | 2/2009 | Kiryuschev | H05B 33/26 349/150 |
| 2010/0306993 A1 | 12/2010 | Mayyas et al. | |
| 2011/0057861 A1 * | 3/2011 | Cok | H01L 51/5209 345/1.3 |
| 2011/0141404 A1 * | 6/2011 | Kim | G02F 1/13336 349/74 |
| 2013/0309792 A1 | 11/2013 | Tischler et al. | |
| 2013/0316487 A1 | 11/2013 | de Graff et al. | |
| 2014/0159043 A1 | 6/2014 | Sakariya et al. | |
| 2015/0301781 A1 * | 10/2015 | Ekkaia | G06F 3/1446 362/237 |
| 2016/0037608 A1 * | 2/2016 | Ikeda | H05B 33/12 362/235 |
| 2016/0093600 A1 | 3/2016 | Bower et al. | |
| 2016/0132281 A1 * | 5/2016 | Yamazaki | G06F 3/1415 345/1.3 |
| 2017/0047393 A1 * | 2/2017 | Bower | H01L 33/58 |
| 2017/0256522 A1 * | 9/2017 | Cok | H01L 27/3255 |
| 2017/0338374 A1 | 11/2017 | Zou et al. | |
| 2018/0323180 A1 * | 11/2018 | Cok | H01L 25/042 |

(56) References Cited

U.S. PATENT DOCUMENTS

FOREIGN PATENT DOCUMENTS

| EP | 3343273 A2 * | 7/2018 | ......... H01L 27/1218 |
| EP | 3343274 A2 * | 7/2018 | ......... H01L 27/3248 |
| EP | 3343551 A1 * | 7/2018 | ........... G06F 3/1446 |
| FR | 3007561 A1 * | 12/2014 | ............... G09G 3/32 |

OTHER PUBLICATIONS

Bower, C. A. et al., Micro-Transfer-Printing: Heterogeneous Integration of Microscale Semiconductor Devises using Elastomer Stamps, IEEE Conference, (2014).

Bower, C. A. et al., Transfer Printing: An Approach for Massively Parallel Assembly of Microscale Devices, IEEE, Electronic Components and Technology Conference, (2008).

Cok, R. S. et al., 60.3: AMOLED Displays Using Transfer-Printed Integrated Circuits, Society for Information Display, 10:902-904, (2010).

Cok, R. S. et al., AMOLED displays with transfer-printed integrated circuits, Journal of SID, 19(4):335-341, (2011).

Cok, R. S. et al., Inorganic light-emitting diode displays using micro-transfer printing, Journal of the SID, 25(10):589-609, (2017).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

* cited by examiner

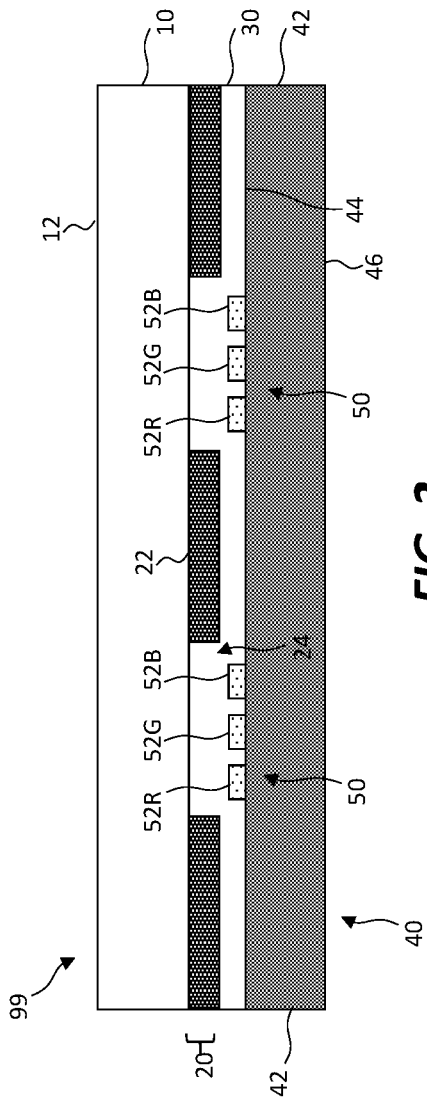
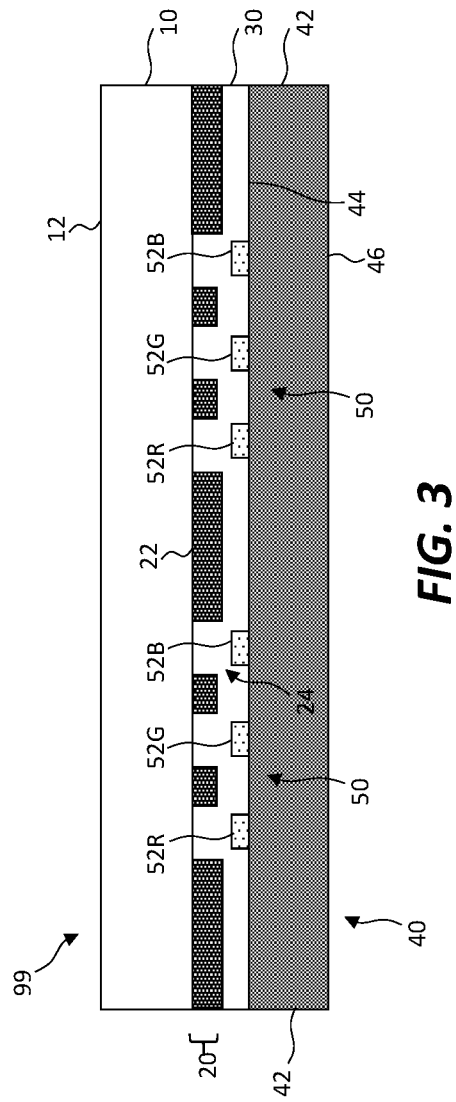

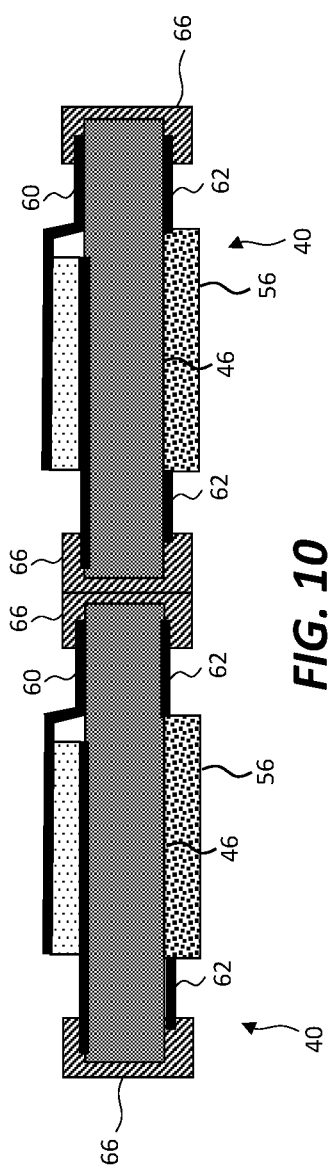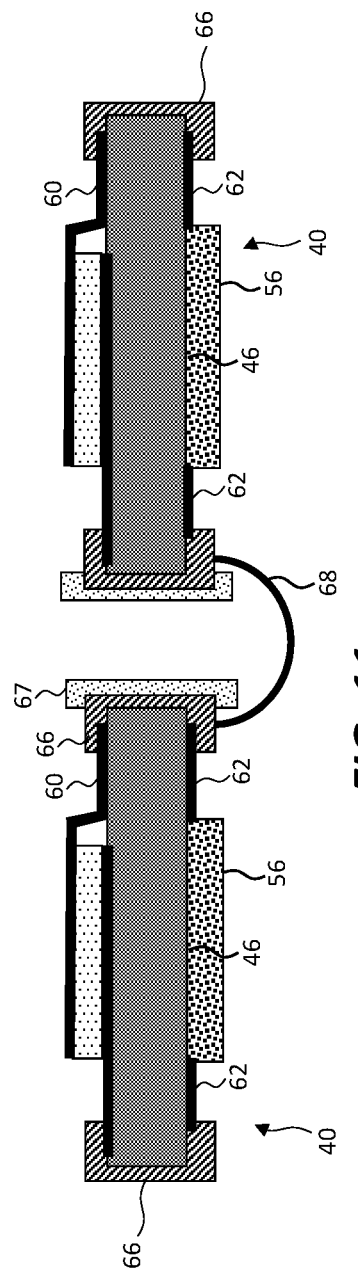

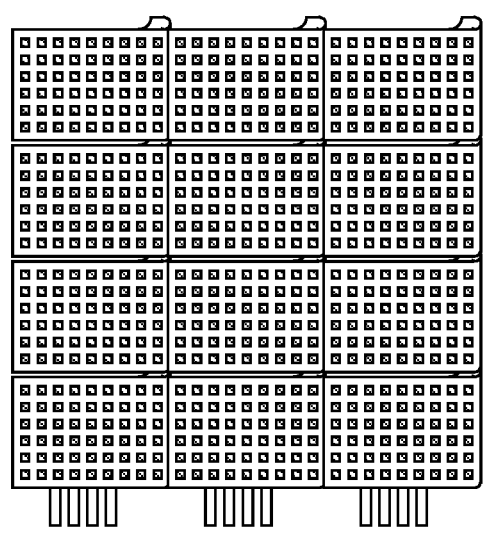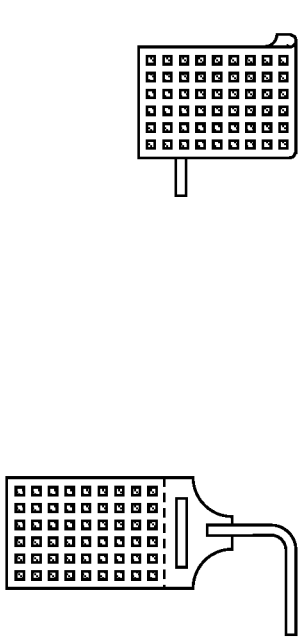
Single flexible display tiles (viewing side) with control chip and power/data connection
Fold at dashed line to accomplish front-to-back electrical connection
Array of bezel-free folded display tiles suitable for bonding to host screen panel
FIG. 23

TILED DISPLAYS WITH BLACK-MATRIX SUPPORT SCREENS

PRIORITY APPLICATION

This application claims the benefit of U.S. Provisional Patent Application No. 62/817,478, filed on Mar. 12, 2019, entitled Tiled Displays with Black-Matrix Support Screens, the content of which is hereby incorporated by reference herein in its entirety.

CROSS REFERENCE TO RELATED APPLICATIONS

Reference is made to commonly owned U.S. Pat. No. 9,741,785, filed Aug. 10, 2015, entitled Display Tile Structure and Tiled Display by Bower et al., and to commonly owned U.S. Pat. No. 10,181,507, filed Jul. 17, 2017, entitled Display Tile Structure and Tiled Display by Bower et al, the disclosures of each of which are incorporated herein by reference in their entirety.

TECHNICAL FIELD

The present disclosure relates to tiled displays and in particular to tiled displays that include black-matrix structures.

BACKGROUND

Large-format outdoor displays typically use inorganic light-emitting diodes (LEDs) individually mounted in a frame and replaced as necessary. In some displays, groups of LEDs are mounted in tiles, the tiles are assembled into a tile frame, and the tile frames are mounted in a display frame. If an LED in a tile fails, the faulty tile is removed, and a good tile replaces the faulty tile. Tiles can be tested before assembly, increasing display yields. The use of tiles increases the available size of a display since each tile is separately made and is much smaller than the size of the display itself. However, the mounting display frame can be larger or heavier than desired and can be visible or create undesirable and visible seams.

A variety of tiled display structures are known. U.S. Pat. No. 5,563,470 discloses a tiled panel display assembly with a common substrate on which multiple small display tiles are mounted in an array and electrically interconnected to form a large-area panel display. Each tile includes a plurality of contact pads that are aligned with corresponding contact pads on the common substrate and are electrically interconnected to provide electrical connections between adjacent tiles. Each of the tiles contains a plurality of metal-filled vias that connect contact pads on the under surfaces of the tiles to electrodes on the upper surface of the tile. Alternatively, electrical connections extend around the outer peripheral surface of the tile substrate. U.S. Pat. No. 8,531,642 shows a similar wrap-around electrical connection.

EP1548571 describes a configurable and scalable tiled OLED display. The OLED materials are deposited in a passive-matrix configuration on a transparent substrate and then interconnected with solder bump technology to a printed circuit board located on top of the transparent substrate. U.S. Pat. No. 6,897,855 describes a different tiled OLED structure with display tiles having picture element (pixel) positions defined up to the edge of the tiles. U.S. Pat. No. 6,897,855 also describes a tiled structure that employs vias through substrates to provide the electrical connections from the driving circuitry to the pixels on the display tiles, as does U.S. Pat. No. 6,853,411. U.S. Pat. No. 6,853,411 also describes locating pixel-driving circuitry beneath an OLED light emitter. Such a structure requires additional layers in a tile structure. In an alternative arrangement, U.S. Pat. No. 7,394,194 describes a tiled OLED structure with electrical standoffs connecting OLED electrodes on a tile substrate with conductors on a back panel. The electrical standoffs are located on the edge of each tile to avoid compromising the environmental integrity of the OLED materials on the tile.

Inorganic light-emitting diode displays using micro-LEDs (for example having an area less than 100 microns square or having an area small enough that it is not visible to an unaided observer of the display at a designed viewing distance) are also known. U.S. Pat. No. 8,722,458, entitled Optical Systems Fabricated by Printing-Based Assembly, teaches transferring light-emitting, light-sensing, or light-collecting semiconductor elements from a wafer substrate to a destination substrate. U.S. Pat. No. 5,739,800 describes an LED display chip with an array of micro-LEDs mounted on a mounting substrate and electrically connected to a driver substrate. However, this arrangement requires multiple substrates and the use of vias to connect integrated circuits on the driver substrate to the LED display substrate and is not suitable for a scalable tiled structure.

Some displays use light-emitting structures on a backplane together with integrated circuits mounted on the backplane to provide control signals to the light-emitting structures. As discussed in U.S. Pat. No. 5,686,790, integrated circuits mounted on the light-emitting side of the backplane unnecessarily increase the size of the backplane while integrated circuits mounted on the side of the backplane opposite the light-emitting structures require electrical vias through the backplane or electrical leads wrapped around the edge of the backplane to electrically connect the integrated circuits with the light-emitting structures. Such vias and leads are difficult and expensive to construct. Integrated circuits located within the display area of a display reduce the resolution and aperture ratio of the display. In flat-panel displays such as LCDs and OLEDs, a reduced aperture ratio also reduces the brightness or lifetime of the display.

Light-absorbing black-matrix layers are commonly used to absorb ambient light in a display and are typically disposed in a layer coated over a light-emitter layer in the display. Such black-matrix layers improve the contrast of the display. U.S. Pat. No. 7,239,367 entitled Tiled Display Device with Black Matrix Film having Different Aperture Ratios to Jin et al., describes such a display.

Multi-layer printed circuit boards (PCBs) are widely used in digital electronic systems to interconnect electronic elements such as integrated circuits and passive components such as resistors and capacitors. Such printed circuit boards include layers of insulating material interdigitated with patterned conductive layers such as etched copper sheets laminated with electrically conductive through-hole vias to interconnect the electronic elements, for example as disclosed in U.S. Pat. No. 4,591,659. However, these PCBs can be limited in the spatial resolution provided for integrated circuit electrical interconnections. Daughter cards used in conjunction with motherboards (i.e., smaller printed circuit boards mounted upon and electrically connected to larger printed circuit boards) are also known but likewise have limited spatial resolution, orientation, and integration provided for integrated circuits.

Thus, there remains a need for a display tile structure that is simple to make and has increased contrast, manufacturability, and an improved form factor in a robust structure for a tiled display.

SUMMARY

In some embodiments of the present disclosure, a tiled display structure comprises a screen support having a screen emitter side and an opposing screen back side. The tiled display structure can have only a single screen support. A black matrix comprises a patterned layer of black-matrix material disposed on the screen back side. The pattern defines pixel openings substantially devoid of black-matrix material. An array of tiles each comprise a tile substrate and a plurality of pixels disposed in or on the tile substrate. Each pixel comprises one or more light emitters. The one or more light emitters are each disposed to emit light through a pixel opening in the black matrix. A substantially transparent adhesive layer adheres the array of tiles to the black-matrix material.

In some embodiments, each of the pixels can comprise a plurality of light emitters and the plurality of light emitters of each pixel emit light through a common pixel opening in the black matrix. In some embodiments, each pixel comprises a plurality of light emitters and each light emitter of the plurality of light emitters of each pixel emits light through a different pixel opening in the black matrix.

In some embodiments, each of the pixels comprises a red-light emitter that emits red light, a green-light emitter that emits green light, and a blue-light emitter that emits blue light. One or more light emitters of each pixel of the plurality of pixels can each be a light-emitting diode (LED). Each of the light-emitting diodes can be a micro-LED having at least one of a length and width no greater than 200 microns, no greater than 100 microns, no greater than 50 microns, no greater than 20 microns, no greater than 10 microns, no greater than 5 microns, or no greater than 2 microns. Each light-emitting diode can comprise a fractured or separated tether.

In some embodiments, at least some of the pixel openings comprise a color filter. In some embodiments, black-matrix material is disposed in contact with and disposed between tile substrates and can adhere tile substrates together.

In some embodiments, two or more adjacent tiles in the array of tiles are butted together. In some embodiments, the pixels are disposed at a regular pixel pitch in a direction and the pixel openings have an opening size in the direction that is no greater than one half the pixel pitch, no greater than one quarter the pixel pitch, no greater than one fifth the pixel pitch, no greater than one tenth the pixel pitch, no greater than one twentieth the pixel pitch, no greater than one fiftieth the pixel pitch, no greater than one hundredth the pixel pitch, no greater than one five hundredth the pixel pitch, or no greater than one thousandth the pixel pitch. In some embodiments, the pixels are disposed at a regular pixel pitch in a direction and a distance between a pixel at an edge of a tile and the edge of the tile is no greater than one half the pixel pitch.

The substantially transparent adhesive can be an optically clear adhesive. An optically clear adhesive can have a transparency of, for example, no less than 50% (e.g., no less than 75%, no less than 85%, no less than 90%, no less than 95%, or no less than 98%) to light, for example visible light or light emitted by the one or more light emitters.

Each tile substrate of the array of tiles can have a tile emitter side and a tile back side and the one or more light emitters disposed on the tile substrate are disposed on the tile emitter side. Emitter-side electrodes can be disposed on the tile emitter side and back-side electrodes can be disposed on the tile back side and electrical connections can electrically connect the emitter-side electrodes to the back-side electrodes. The electrical connections can be made with through-via connections that pass through the tile substrate or can be made with wrap-around connections that are at least partly disposed on one or more edges of the tile substrate.

In some embodiments, each tile comprises a pixel controller disposed on the tile back side electrically connected to the back-side electrodes that controls the one or more light emitters in each of the pixels disposed on the tile substrate.

Tiled display structures can comprise one or more bus connections and the one or more bus connections can be electrically connected to the back-side electrodes of at least one tile. Each tile can comprise one or more separate bus connections electrically connected to the back-side electrodes of the tile. The back-side electrodes of one tile can be electrically connected to the back-side electrodes of an adjacent tile adjacent to the one tile. The back-side electrodes of one tile can be electrically connected to the back-side electrodes of an adjacent tile adjacent to the one tile with one or more of: a jumper comprising a jumper substrate, connection posts, and a fractured or separated tether, one or more wire bonds, and one or more wrapped connections.

In some embodiments, at least some of the back-side electrodes of a subset of the array of tiles are commonly connected and each of the commonly connected back-side electrodes is electrically connected to a bus connection. In some embodiments, the tiles are disposed in rows and the back-side electrodes of ones of the tiles in a row are electrically connected in common.

In some embodiments, the tile substrates are flexible substrates. In some embodiments, a portion of one tile substrate is at least partially folded behind a portion of another tile substrate adjacent to the one tile substrate, as viewed through the screen support. The portion of the one tile substrate can be a bezel portion or a pigtail portion. In some embodiments, the tile substrates comprise a pigtail that electrically connects the one or more light emitters to a bus connection.

The use of small, bright emitters, for example micro-LEDs, enables a low-aperture ratio display, in contrast to OLED displays and LCDs, having increased area for interconnections between the light emitters as well as additional circuitry that enhances the functionality of the tiles. A low-aperture ratio display (for example having an aperture ratio of no greater than 20%, no greater than 10%, no greater than 1%, no greater than 0.5%, or no greater than 0.1%) can enable visually seamless tiling by increasing the distance between a pixel and an edge of a tile substrate.

Furthermore, the present disclosure enables reduced-cost construction by providing tiles that are formed using very small components, for example micro-LEDs disposed on the tiles by micro-transfer printing, and small interconnections, for example made using photolithographic methods that enable a very high-resolution display that is then electrically connected to low-resolution contact pads electrically available to bus connectors, which can then be constructed using a much lower resolution and less expensive technology, for example using parts, materials, and methods that are commonly used in printed circuit board manufacturing. A pixel controller can control more than one pixel, for example all of the pixels on a tile substrate.

Tiles can also be made on a flexible tile substrate disposed on a rigid tile substrate that is subsequently removed, thereby forming a very thin structure that can be flexible. If the screen support is also flexible, very large, flexible displays can be constructed.

In certain embodiments, the display includes a plurality of tiles with light emitters arranged in a regular array. In certain embodiments, the display includes an index matching or light-absorbing layer located between the tiles. In certain embodiments, the tile comprises glass, a polymer, a curable polymer, sapphire, silicon carbide, metal, copper, or diamond.

In certain embodiments, the tile comprises one or more passive electrical components mounted onto, formed on, or formed in a tile substrate. In certain embodiments, the passive electrical components are resistors, capacitors, antennas, or inductors. In certain embodiments, the tile includes one or more active electrical components mounted onto, formed on, or formed in a tile substrate. In certain embodiments, the active electrical components are transistors, integrated circuits, power supplies, or power-conversion circuits. In certain embodiments, at least one of the active electrical components is a driver that drives one or more of the light emitters.

In certain embodiments, the light-emitter is a red-light emitter that emits red light, and some embodiments comprise a green-light emitter that emits green light and a blue-light emitter that emits blue light. In certain embodiments, the tile includes a plurality of pixels and light emitters. In certain embodiments, the tile includes redundant red-light, green-light, and blue-light emitters. In certain embodiments, the red, green, and blue light emitters form a full-color pixel in a display.

In some embodiments, a structure includes a tiled display including a plurality of tiles. The tiles can be display tiles and can be removable or replaceable.

In some embodiments, a method of making a tiled display structure comprises: providing a plurality of tiles, each of the tiles comprising a tile substrate and a plurality of pixels disposed in or on the tile substrate, each pixel comprising one or more light emitters; providing a screen support having a screen emitter side and an opposing screen back side; providing a black matrix comprising a patterned layer of black-matrix material disposed on the screen back side, the pattern defining pixel openings that are substantially devoid of black-matrix material; and adhering the tiles to the black matrix with a layer of substantially transparent adhesive such that each of the one or more light emitters of each of the plurality of tiles is disposed to emit light through one of the pixel openings in the black matrix.

In some embodiments, providing the black matrix comprises disposing [e.g., printing (e.g., ink-jet printing) or coating] the black-matrix material on the screen support in a patterned layer. In some embodiments, providing the black matrix comprises photolithographically processing an unpatterned layer of black-matrix material [e.g., formed by printing or coating (e.g., spin-coating)] to form the patterned layer of the black-matrix material.

In some embodiments, disposing the layer of substantially transparent adhesive on the black matrix (e.g., and in the pixel openings) and then adhering the tiles to the layer of substantially transparent adhesive. In some embodiments, the method comprises arranging the tiles in an array; disposing the layer of substantially transparent adhesive on the tiles; and adhering the black matrix to the layer of substantially transparent adhesive. In some embodiments, the method comprises: determining that each of one or more of the tiles is a defective (e.g., by visual inspection or optical, electronic, or optoelectronic testing); removing (e.g., peeling off) the one or more of the tiles that is defective from the layer of substantially transparent adhesive; and adhering an additional tile to the layer of substantially transparent adhesive for each of the one or more of the tiles that was removed. In some embodiments, the method comprises: determining whether the additional tile that replaced the one or more of the tiles that was defective is defective; and replacing any additional tile that is determined to be defective.

The present disclosure provides, inter alia, a tiled display having reduced thickness, improved functionality and manufacturability, and reduced manufacturing cost, as well as improved contrast and uniformity. In some embodiments, a single screen support can provide a global reference for all of the tile substrates of tiles, which reduces alignment runout and improve uniformity.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 2-4 are cross sections of tiles according to some illustrative embodiments of the present disclosure;

FIGS. 9-11 are cross sections of electrically connected adjacent tiles according to some illustrative embodiments of the present disclosure;

FIG. 23 shows display tiles being prepared in an array for mounting to a host screen panel, according to some illustrative embodiments of the present disclosure.

Figure 1:
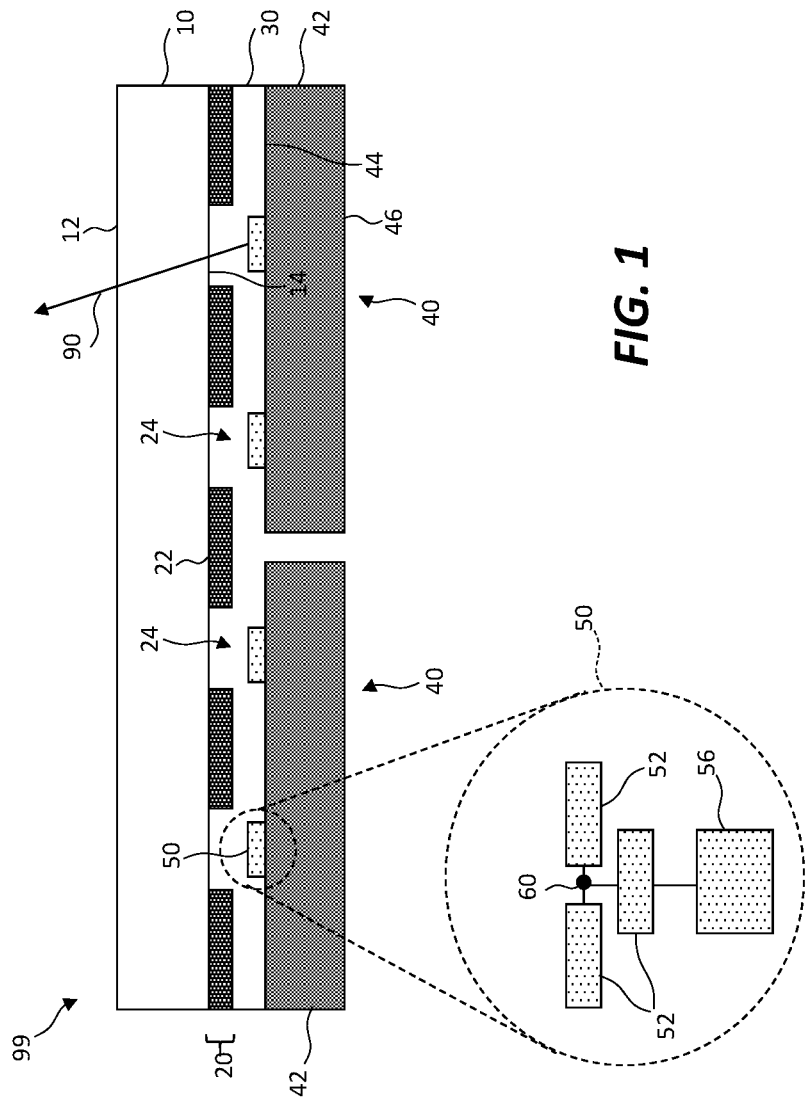
FIG. 1 is a cross section with an inset top view of a pixel on a tile substrate according to some illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale since the variation in size of various elements in the Figures is generally too great to permit depiction to scale.

DETAILED DESCRIPTION OF CERTAIN EMBODIMENTS

Referring to the cross section and inset of FIG. 1, a tiled display structure 99 comprises a screen support 10 having a screen emitter side 12 and an opposing screen back side 14. Screen support 10 can be a single screen support and can serve as a display substrate for the tiled display structure 99. A black matrix 20 comprising a patterned layer of black-matrix material 22 is disposed on screen back side 14. The patterned layer defines pixel openings 24 that are substantially devoid of black-matrix material 22. An array of tiles 40 each comprises a tile substrate 42 having a tile emitter side 44 and an opposing tile back side 46 and a plurality of pixels 50 disposed in or on tile substrate 42, for example on tile back side 46. Each pixel 50 comprises one or more light emitters 52. The one or more light emitters are 52 are each disposed to emit light 90 through a corresponding pixel opening 24. A substantially transparent adhesive layer 30 of substantially transparent adhesive adheres the array of tiles 40 to black-matrix material 22. Transparent adhesive layer 30 can be a releasable adhesive so that tiles 40 can be removed (e.g., by peeling) and replaced. Pixels 50 can comprise a plurality of light emitters 52 and can be controlled by pixel controller 56 electrically connected to pixels 50 by emitter-side electrodes 60, for example in an active-matrix embodiment. Pixel controller 56 can control all of pixels 50 in a tile 40 or multiple pixel controllers 56 can be provided, for example for some but not all of pixels 50 in a tile 40 or for individual pixels 50 or for individual subpixels of pixels 50.

Screen support 10 can comprise any useful substrate, for example as found in the display industry, capable of transmitting light 90 emitted by light-emitters 52, for example but not limited to glass, plastic, sapphire, or quartz. Screen emitter side 12 and opposing screen back side 14 can be substantially or effectively parallel, for example within the limitations of a suitable manufacturing process. Screen support 10 can comprise one or more fiducial markings, for example one or more screen fiducial markings for aligning screen support 10 and tile fiducial markings to facilitate alignment of tiles 40 with screen support 10. Screen support 10 can be substantially transparent to light 90 emitted from light emitters 52, for example at least 50% (e.g., at least 75%, at least 80%, at least 90%, at least 95%, or at least 98%) transparent to visible light.

Black-matrix material 22 can comprise a polymer or resin and can be curable so that it can be applied as a liquid (e.g., a viscous liquid) to screen back side 14 and cured to form a solid. Black-matrix material 22 can comprise carbon black, dyes, pigments, or other visible light-absorbing material, for example having a black appearance to a human observer. Black-matrix material 22 can be patterned using photolithographic processes known in the display art, such as spray or spin coating and patterning with photoresist, to form black matrix 20 defining pixel openings 24. Pixel openings 24 can be substantially transparent to light 90 emitted from light emitters 52, for example at least 50% (e.g., at least 75%, at least 80%, at least 90%, at least 95%, or at least 98%) transparent to visible light.

Adhesive layer 30 can comprise a curable material, for example a resin or polymer that can be cured with heat or radiation, for example ultra-violet radiation. Adhesive layer 30 can be a layer of optically clear adhesive. In some embodiments, adhesive layer 30 is a layer of commercially available optically clear adhesive (e.g., provided as liquid optically clear adhesive (LOCA) and then cured). Adhesive layer 30 can be non-curable or comprise a cured material, such as PDMS for example. Adhesive layer 30 can provide an adhesion from which tiles 40 can be removed or replaced, for example by peeling a defective tile 40 from adhesive layer 30 and then pressing a new tile 40 onto adhesive layer 30. For example, if a tile 40 fails, the failed tile 409 can be removed and another tile 40 adhered in its place. PDMS can provide such an adhesive layer 30 that allows for removal and replacement of defective tiles 40. Adhesive layer 30 can be substantially transparent to light 90 emitted from light emitters 52, for example at least 50% (e.g., at least 75%, at least 80%, at least 90%, at least 95%, or at least 98%) transparent to visible light.

Tile substrate 42 can be rigid or flexible and can, for example, comprise glass, or polymer, or other materials known in the display or integrated circuit industry. Tile substrate 42 can be, but need not necessarily be, transparent. In some embodiments of the present disclosure, tile substrate 42 is opaque or is partially coated with a light-absorbing layer, for example a polymer layer comprising carbon black, dyes, or pigments. In some embodiments, tile substrate 42 can be processed using photolithographic processes known in the display arts. The array of tiles 40 can be arranged in a rectangular array or in a row or column. Tile emitter side 44 and opposing tile back side 46 can be substantially or effectively parallel, for example within the limitations of a suitable manufacturing process. Tile substrate 42 can comprise one or more fiducial markings to facilitate alignment of tiles 40 with screen support 10.

Figure 4:
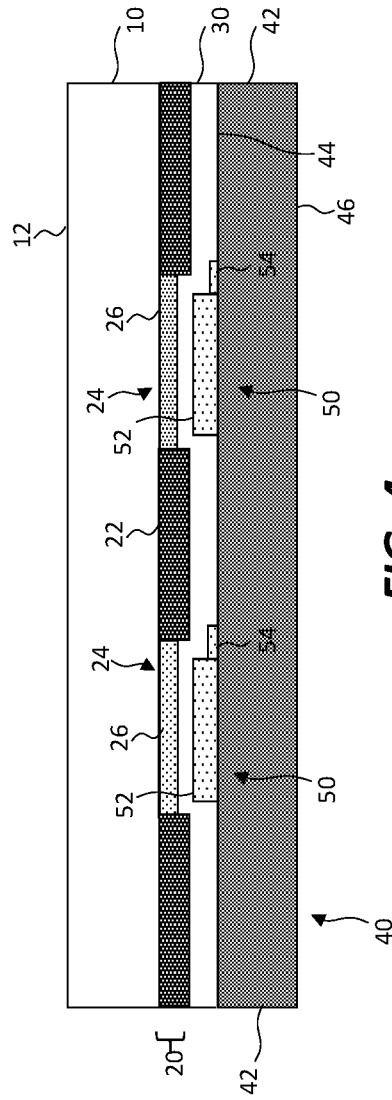

Light emitters 52 can comprise inorganic light-emitting diodes (iLEDs) and can be disposed on tile emitter side 44 of tile substrate 42 by micro-transfer printing the iLEDs from a native LED source wafer to tile emitter side 44 of non-native tile substrate 42. As a part of the micro-transfer printing process, micro-LED light emitters 52 can comprise a fractured or separated light-emitter tether 54 (for example as shown in FIG. 4). Micro-transfer printed inorganic micro-LEDs can be relatively small, for example having at least one of a width and a length no greater than 200 microns (e.g., no greater than 100 microns, no greater than 50 microns, no greater than 20 microns, no greater than 10 microns, no greater than 5 microns, or no greater than 2 microns). Light emitters 52 can be interconnected on tile emitter side 44 with emitter-side electrodes 60, for example using photolithographic processes and materials to construct patterned electrical wires on tile substrate 42 and light emitters 52, as discussed further below.

Referring to FIGS. 2 and 3, pixels 50 comprise three light emitters 52, a red-light emitter 52R that emits red light, a green-light emitter 52G that emits green light, and a blue-light emitter 52B that emits blue light. Referring to FIG. 2, the plurality of light emitters 52R, 52G, 52B of each pixel 50 can emit light 90 through a single, common pixel opening 24 in black matrix 20. As shown in FIG. 3, red, green, and blue light emitters 52R, 52G, 52B of each pixel 50 can each emit light 90 through a different pixel opening 24 in black matrix 20.

In some embodiments of the present disclosure, pixel openings 24 are empty (e.g., comprise air or a gas or are under vacuum). In some embodiments, pixel openings 24 comprise a transparent material (e.g., the transparent adhesive material of adhesive layer 30). Referring to FIG. 4, at least some of pixel openings 24 comprise a color filter 26. Color filter 26 can, for example, filter light 90 emitted from corresponding light emitters 50. Color filter 26 can improve the quality of the emitted light, for example improving the purity of emitted light 90 to improve the color gamut of tiled display structure 99.

Figure 5:
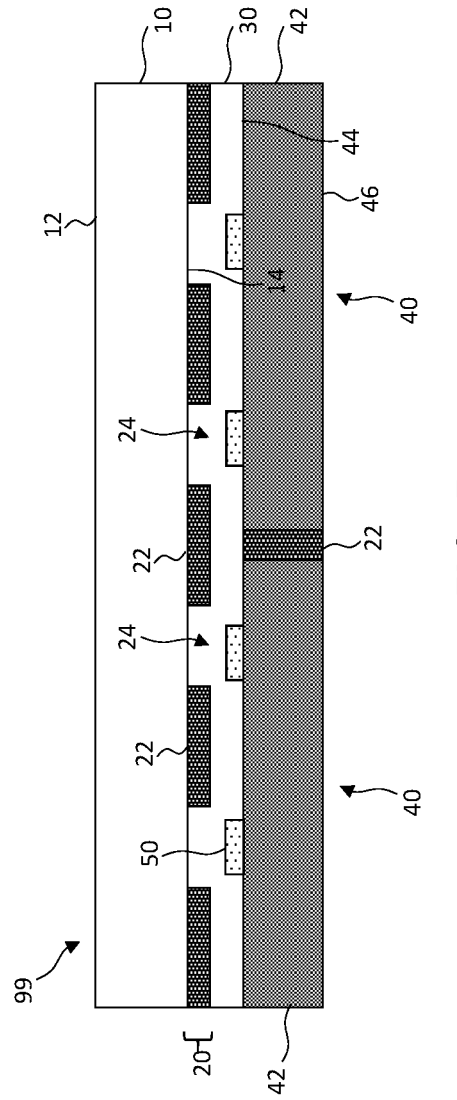
FIGS. 5-6 are cross sections of adjacent tiles according to some illustrative embodiments of the present disclosure.

Referring to FIG. 5, black-matrix material 22 is disposed between and in contact with two or more adjacent tiles 40. Adjacent tiles 40 are two tiles 40 that do not have any other tile 40 between them. Black-matrix material 22 can absorb light and can hide or obfuscate the seams between adjacent tiles 40. Black-matrix material 22 can also adhere adjacent tiles 40 together, increasing the physical robustness of tiled display structure 99.

Figure 6:
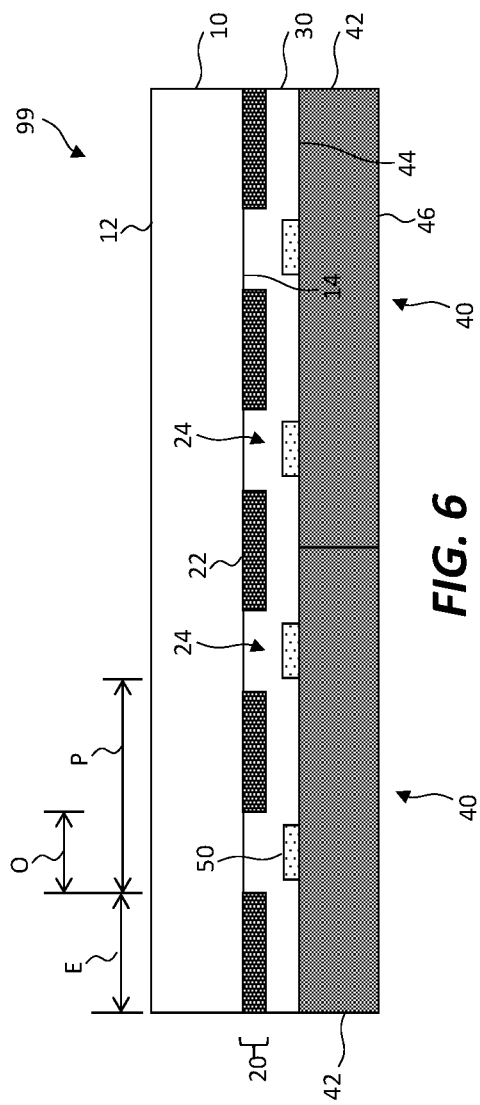

Referring to FIG. 6, two or more adjacent tiles 40 are butted together and adhered to a single screen support 10. In some embodiments of the present disclosure and as illustrated in FIG. 6, pixels 50 are disposed at a regular pixel pitch P in a direction and pixel openings 24 have an opening size O in the direction that is no greater than one of half pixel pitch P, no greater than one quarter of pixel pitch P, no greater than one fifth of pixel pitch P, no greater than one tenth of pixel pitch P, no greater than one twentieth of pixel pitch P, no greater than one fiftieth of pixel pitch P, no greater than one hundredth of pixel pitch P, no greater than one five hundredth of pixel pitch P, or no greater than one thousandth of pixel pitch P. In some embodiments, pixels 50 are disposed at a regular pixel pitch P in a direction and an edge distance E between a pixel 50 at an edge of a tile substrate 42 and the edge of the tile substrate 42 is no greater than one half pixel pitch P.

Figure 8:
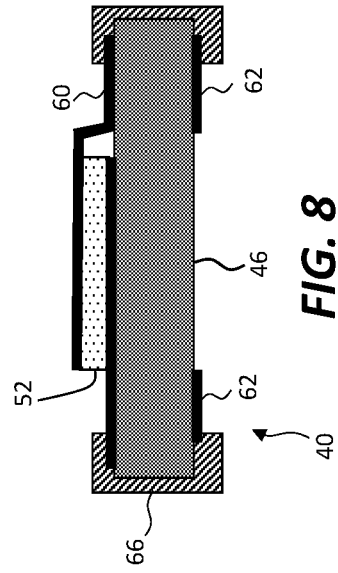
FIGS. 7-8 are cross sections of tiles according to some illustrative embodiments of the present disclosure.
Figure 7:
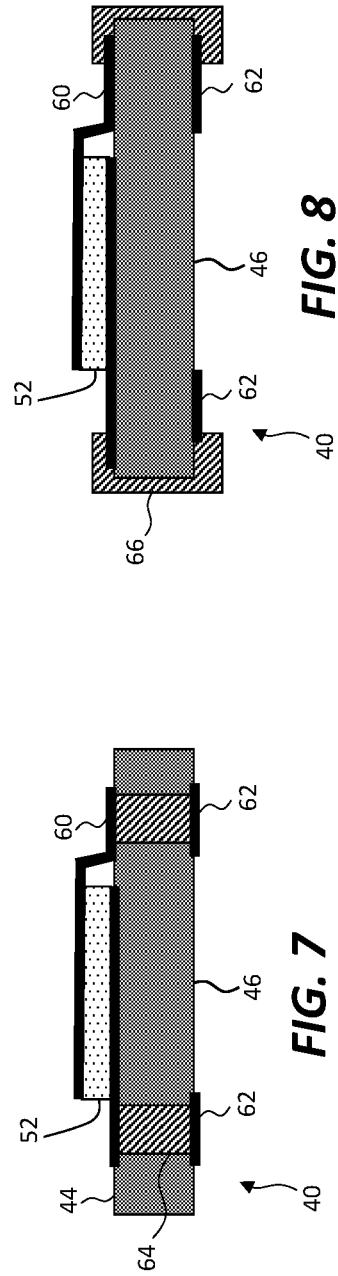

Referring to FIGS. 7 and 8, tiles 40 comprise tile substrate 42 with tile emitter side 44 and opposing tile back side 46. One or more emitter-side electrodes 60 are disposed on tile emitter side 44 and can be electrically connected to light emitter 52 electrical contacts to provide electrical signals to light emitter 52 and causing light emitter 52 to emit light 90. Back-side electrodes 62 are disposed on tile back side 46 and can be electrically connected to emitter-side electrodes 60, for example with through-via connections 64 that pass through tile substrate 42 (as shown in FIG. 7) or with wrap-around connections 66 that extend over an edge of tile substrate 42 (as shown in FIG. 8). Back-side electrodes 62 can be electrically connected to power, ground, or control signals from a tiled display structure 99 controller external to tiled display structure 99 (not shown). Each light emitter 52 in pixel 50 can be similarly connected (e.g., with its own emitter-side electrode 60 and back-side electrode 62 or with a common emitter-side electrode 60 or back-side electrode 62).

Figure 9:
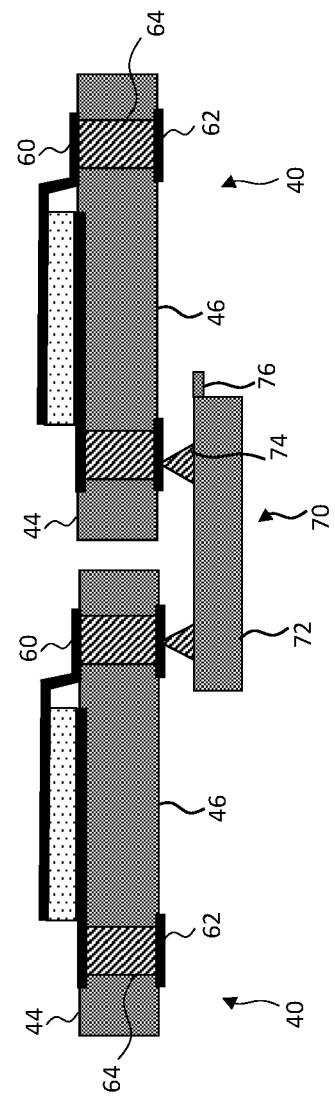

Adjacent tiles 40 can be electrically connected together, for example as shown in FIGS. 9-11. Referring to FIG. 9, a jumper 70 comprising a jumper substrate 72 with jumper connection posts 74 extending away from jumper substrate 72, for example spikes having a sharp point, electrically connects back-side electrodes 62 on adjacent tile substrates 42. In some embodiments, jumper 70 can be micro-transfer printed from a native jumper source wafer to non-native tile substrate 42 can comprise a fractured or separated jumper tether 76. Referring to FIG. 10, back-side electrodes 62 on adjacent tile substrates 42 are electrically connected by wrap-around connections 66 butted together. Referring to FIG. 11 (and in some embodiments FIG. 25), back-side electrodes 62 on adjacent tile substrates 42 are electrically connected by bond wires 68 (also known as wire bonds) and wrap-around connections 66 are insulated with insulator 67 to prevent undesired electrical connections. Adjacent tiles 40 can be electrically connected in a row or two-dimensional array of tiles 40, for example a sub-array of the array of tiles 40, for example as shown in the FIG. 12 row of tiles 40.

Figure 12:
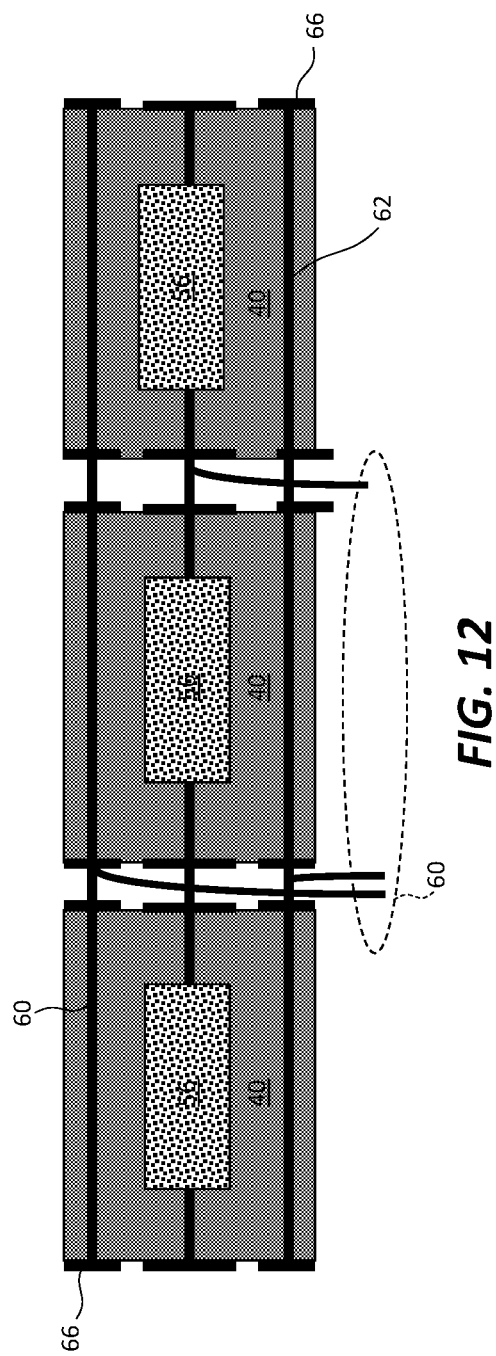
FIGS. 12-13 are bottom views of electrically connected adjacent tiles according to some illustrative embodiments of the present disclosure.
Figure 13:
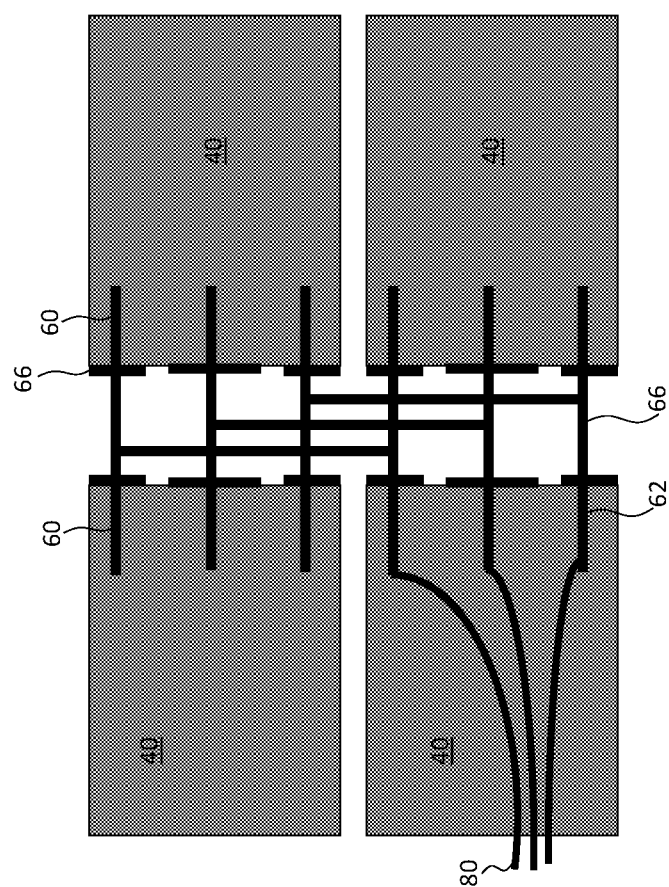

In some embodiments of the present disclosure, and as shown in FIG. 12, groups (e.g., sub-arrays) of tiles 40 in the array of tiles 40 are electrically connected together and each group is electrically connected to a separate bus connection 80, for example a group of electrical connections in a common cable with multiple wires are electrically connected to back-side electrodes 62 so that the group of tiles 40 is controlled by an external tiled display structure 99 controller. The group of tiles 40 can be arranged in one dimension (e.g., a row of tiles 40, as in FIG. 12) or in two dimensions, for example in a two-by-two array (e.g., as shown in FIG. 13).

Figure 14:
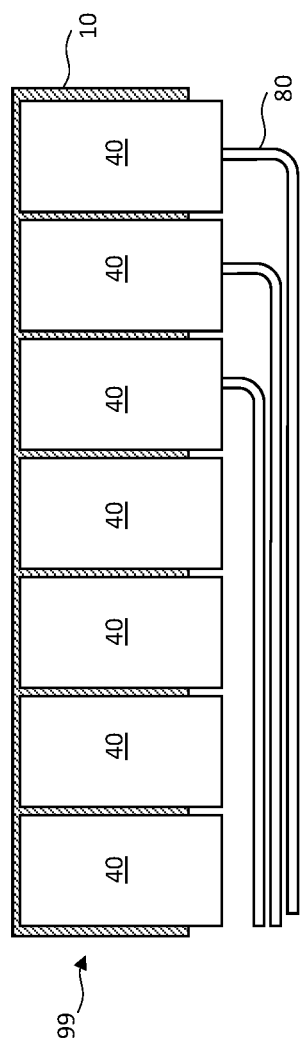
FIGS. 14-15 are bottom views of a one-dimensional and two-dimensional array of tiles, respectively, according to some illustrative embodiments of the present disclosure.
Figure 15:
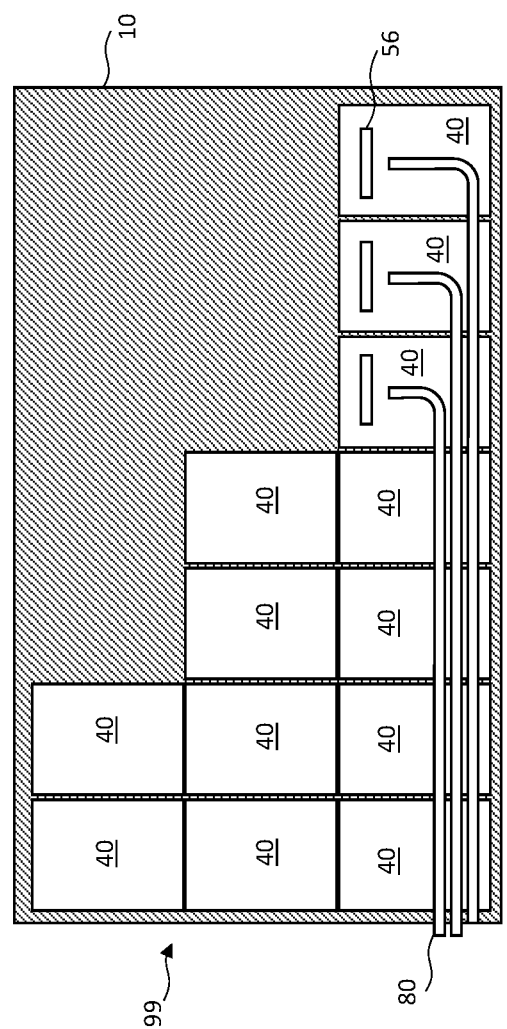
Figure 17:
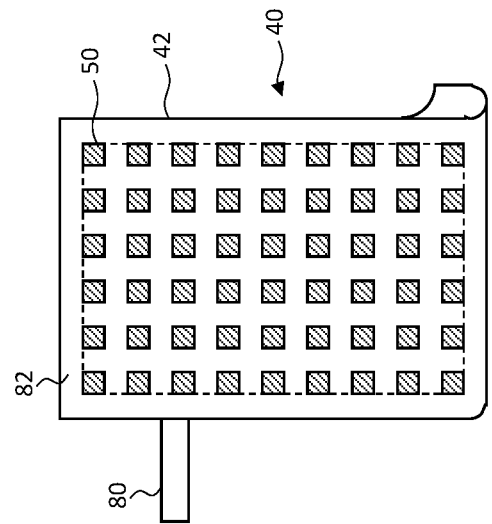
FIGS. 16-17 are bottom views of tiles according to some illustrative embodiments of the present disclosure.
Figure 16:
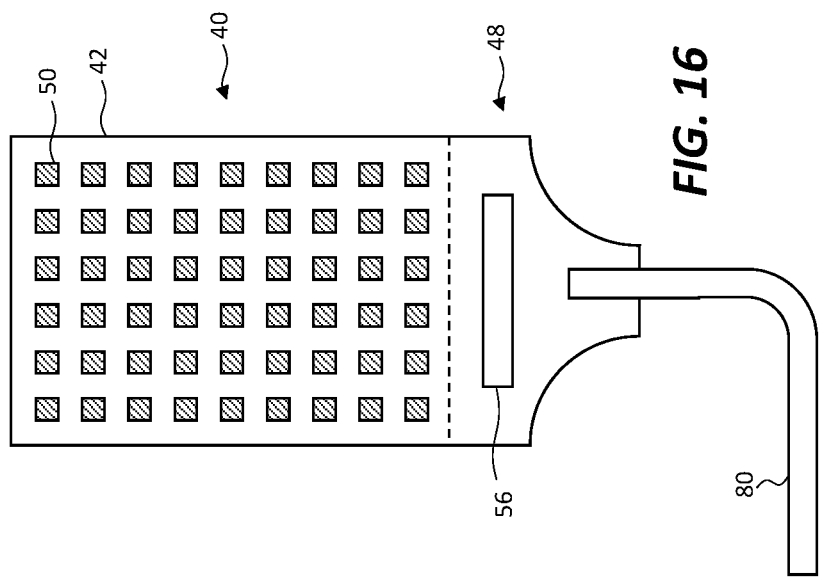
Figure 21A:
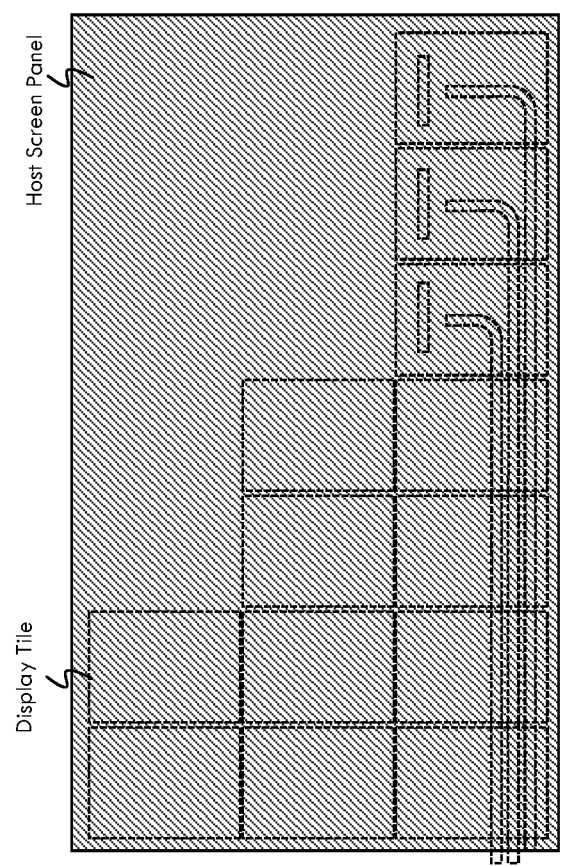
FIG. 21A shows an example of a tiled display structure that includes a 2-D display tile array, according to some illustrative embodiments of the present disclosure.
Figure 21B:
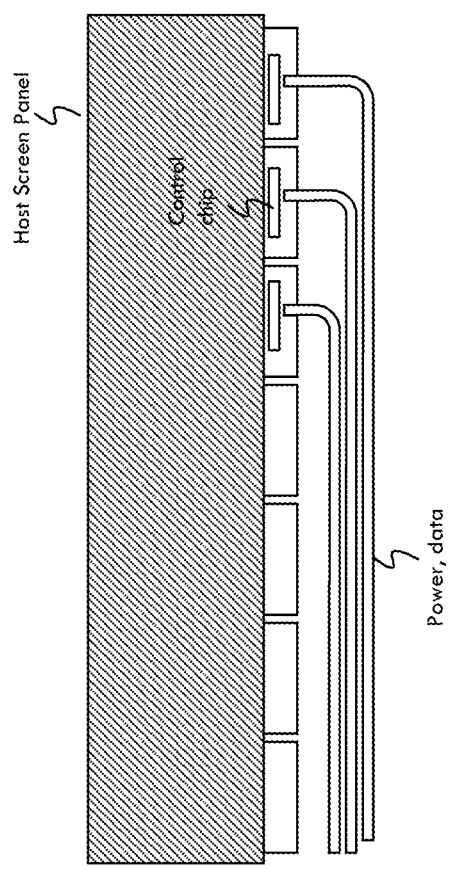
FIG. 21B shows an example of a tiled display structure that includes a 1-D display tile array, according to some illustrative embodiments of the present disclosure.
Figure 22:
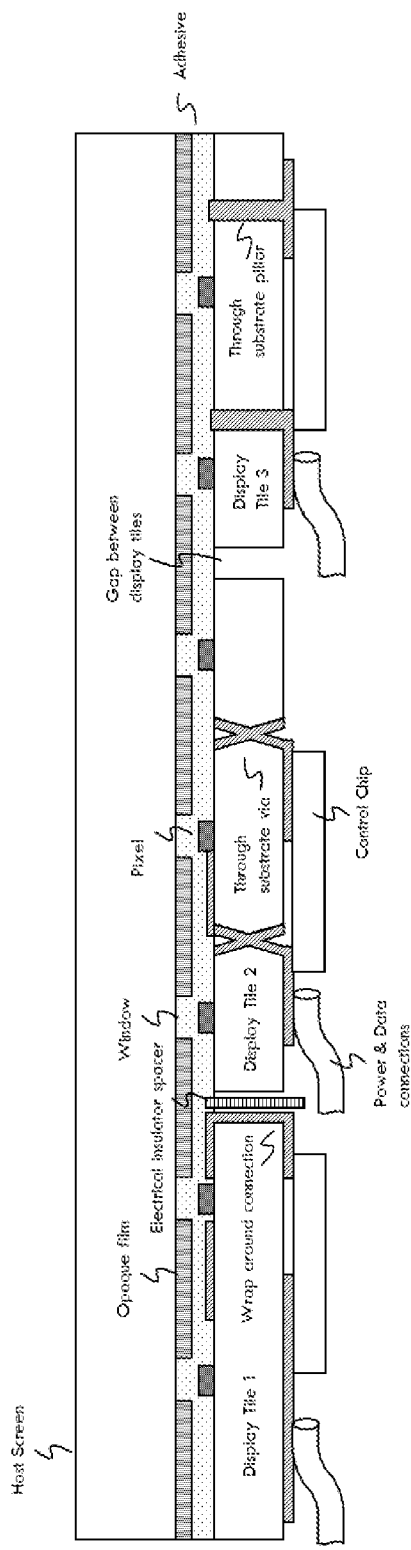
FIG. 22 shows a view of a tiled display structure that includes a display tile array, according to some illustrative embodiments of the present disclosure.

In some embodiments of the present disclosure and as shown in the one-dimensional tile array of FIG. 14 and the two-dimensional tile array of FIG. 15 (e.g., and as also shown in FIGS. 21A, 21B, and 22), each tile 40 in the array of tiles 40 is separately connected to a separate bus connection 80, for example a group of electrical connections in a common cable with multiple wires are electrically connected to back-side electrodes 62 so that each tile 40 is independently controlled by an external tiled display structure 99 controller. (For clarity, only some of the separate bus connections are illustrated in FIGS. 14 and 15, but, according to some embodiments, a bus connection 80 is electrically connected to several or every tile 40 in the array of tiles 40.) Referring to FIG. 16 (and in some embodiments, FIG. 24), each tile substrate 42 can comprise a pigtail 48 that extends from a portion of tile substrate 42 on which the one or more light emitters 52 are disposed and provides access to back-side electrodes 62 to enable electrical connections to bus connections 80, for example with a connector. Referring to FIG. 17, each tile substrate 42 can comprise a bezel 82 surrounding the one or more light emitters 52 that can be folded to enable a closer arrangement of adjacent tiles 40. A bezel portion 82 is a perimeter portion of a display or display tile substrate 42 that is exterior to a display area in which light emitters 52 are disposed, e.g., as shown in FIG. 17. FIG. 21C describes various features that can be, but are not necessarily, included in a one-dimensional or two-dimensional array of tiles 40 in a tiled display structure 99.

Figure 18:
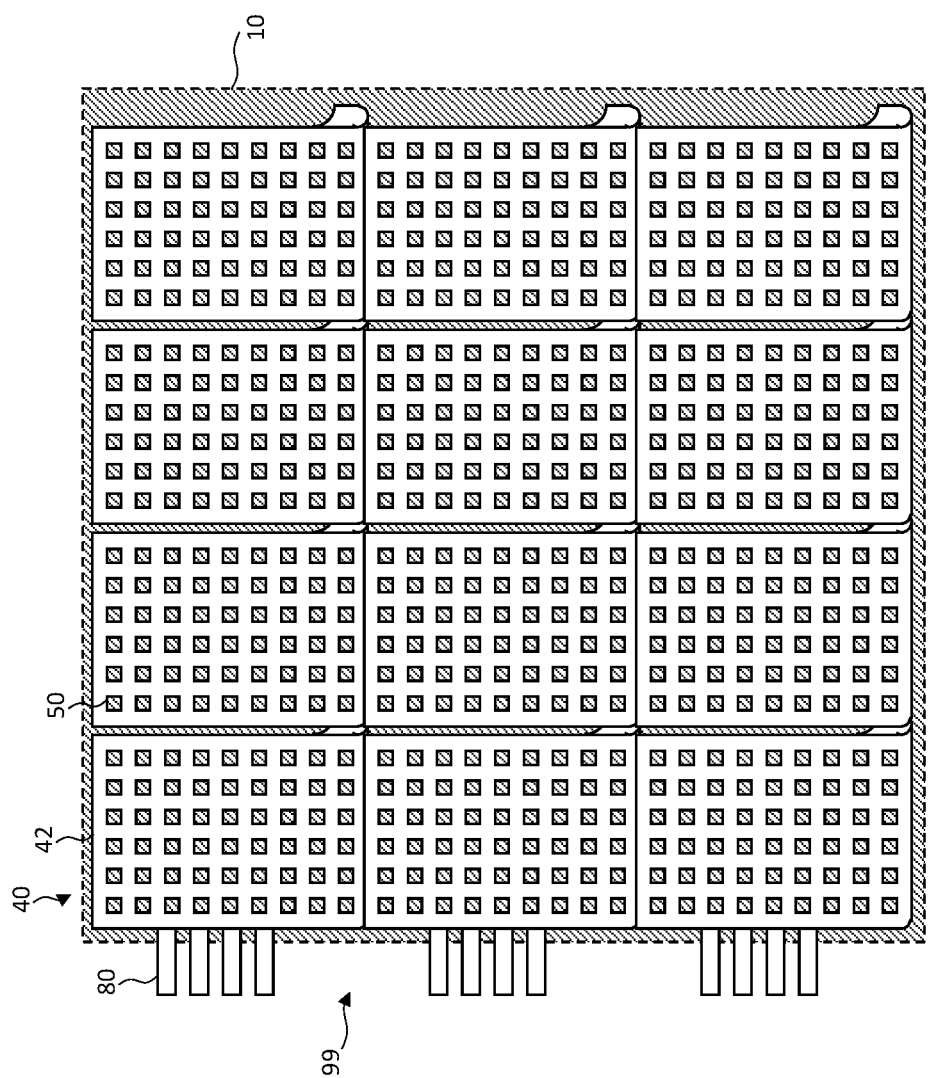
FIG. 18 is a top view through the screen support according to some illustrative embodiments of the present disclosure.

FIG. 18 illustrates a top view of tiled display structure 99 according to some embodiments viewed through screen support 10 through which pixels 50 emit light. Referring to FIG. 18, tile substrates 42 can be flexible so that a portion of one tile substrate 42 is at least partially folded behind (e.g., when viewed from screen support 10 side) a portion of another tile substrate 42 adjacent to the one tile substrate 42. For example, a bezel portion 82 or a pigtail portion 48 (e.g., as in FIGS. 17, 16) can be at least partially folded behind adjacent tile substrate 42 on a side of tile substrate 42 opposite screen support 10, thereby mechanically enabling a bezel-free multi-tile display area or enabling electrical connections to each tile 40 from an external tiled display structure 99 controller.

Figure 19:
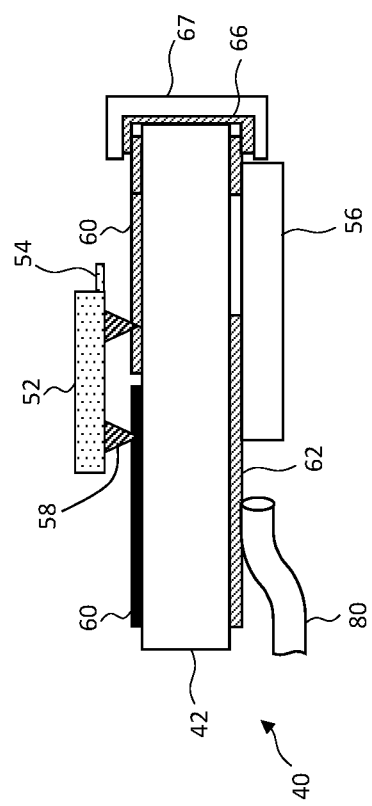
FIG. 19 is a cross section of a tile according to some illustrative embodiments of the present disclosure.

FIGS. 19 and 23A illustrate a portion of tile 40 in more detail, according to some embodiments. FIGS. 19 and 23A illustrate tile substrate 42, emitter-side electrodes 60 electrically contacting light emitter 52 through light-emitter connection posts 58 and back-side electrode 62 with wrap-around connection 66 insulated by insulator 67. Bus connection 80 can contact back-side electrode 62 with an electrical connection that can be facilitated with, for example, a solder joint or a connector. FIG. 23B describes various features that can be, but are not necessarily, included in a tiled display structure 99.

Tiled display structure 99 can be constructed by providing a screen support 10 and tile substrates 42. Black-matrix material 22 is coated on screen support 10 and patterned to define pixel openings 24 in black-matrix material 22, for example using pattern-wise exposed coatings of photo-resist that are developed, etched, and stripped, using conventional photolithographic methods. One or more fiducials can be defined on screen support 10. Tile substrates 42 are provided and back-side electrodes 62 and emitter-side electrodes 60 provided on tile emitter side 44 and tile back side 46, respectively, together with either through-via connections 64 or wrap-around connections 66. Light emitters 52 can be disposed on tile emitter side 44, for example by micro-transfer printing so that light-emitter tethers 54 are fractured or separated and light-emitter connection posts 58 pierce or otherwise contact emitter-side electrodes 60. Light emitters 52 emit light 90 in a direction opposite to tile substrate 42 into pixel openings 24 and through screen support 10. Screen support 10 can comprise additional layers, for example anti-reflection layers. Adhesive layer 30 is disposed on either black matrix 20 or tiles 40, tiles 40 are then aligned with screen support 10 and adhered together. If adhesive layer 30 is curable, adhesive layer 30 is then cured. In some embodiments, adhesive layer 30 is a pressure-sensitive adhesive and tiles 40 are pressed onto adhesive layer 30. In some embodiments, a tile 40 is discovered to be defective (e.g., by visual inspection or optical, electronic, or optoelectronic testing), is removed by peeling the defective tile 40, and replacing the defective tile 40 with another tile 40, by pressing the other tile 40 into the location of the removed defective tile 40.

In some embodiments, in operation, a display controller external to tiled display structure 99 provides control and power signals to tiles 40 in the array of tiles 40 for example through bus connections 80. Bus connections 80 can be provided individually to each tile 40 or provided to groups or subsets of tiles 40 having interconnected back-side electrodes 62. In some embodiments, the group of tiles 40 comprises all of tiles 40. Back-side electrodes 62 conduct the provided power and control signals to each pixel controller 56 (where present), pixels 50, and light emitters 52 to operate light emitters 52. Thus, tiled display structure 99 can provide an active-matrix display, or a passive-matrix display, such as in inorganic micro-light-emitting diode display.

Certain embodiments of the present disclosure provide a tiled display structure for large displays (e.g., in excess of 3 m² in display area). Certain embodiments provide one or more of: a large display from smaller pieces (tiles), invisible (e.g., to an unaided human viewer) seams between tiles of a display, very low reflectance, high ambient contrast, customizable "off state" appearance of a display, tiled active or passive matrix displays, displays with replaceable tiles. In certain embodiments, a display includes a host screen panel (e.g., screen support 10) with an opaque film that has windows with a pitch equal to a pixel pitch and window size smaller than half of the pixel pitch (e.g., smaller than 20% of the pixel pitch). The display may include emissive pixels having a core area in which multiple colored emitters of the pixel are located, where the core area is smaller than the windows in the opaque film. In some embodiments, a rectangular emissive display tile includes pixels having core areas in which multiple emitters are arranged, where the pixels are arranged in columns and rows and at least one edge of the tile is located a distance from the core areas of the nearest row or column of pixels by less than one half of a pixel pitch. In some embodiments, an optically clear adhesive layer connects a host screen panel to a display tile (e.g., a rectangular display tile). For example, a polydimethylsiloxane (PDMS) elastomer film can be applied to a host screen panel and cured.

Figure 20A:
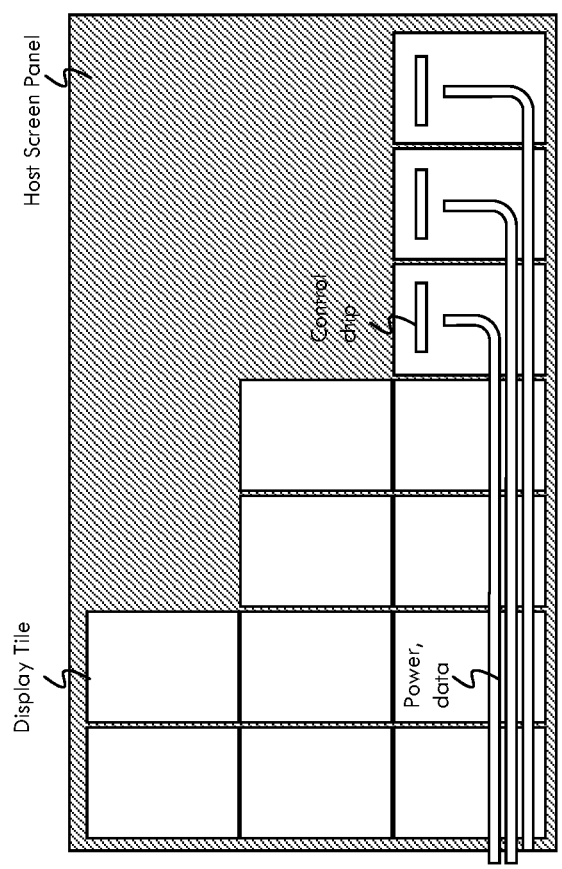
FIG. 20A shows an example of a tiled display structure that includes a 2-D display tile array, according to some illustrative embodiments of the present disclosure.
Figure 20B:
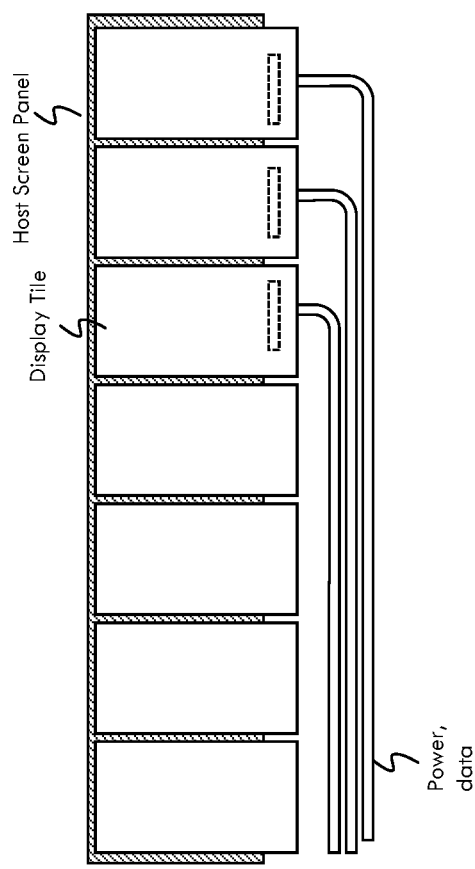
FIG. 20B shows an example of a tiled display structure that includes a 1-D display tile array, according to some illustrative embodiments of the present disclosure.

FIG. 20A shows an example of a 2-D display tile array (each including a control chip (e.g., pixel controller 56)) on a host screen panel (e.g., screen support 10). FIG. 20B shows an example of a 1-D display tile array on a host screen panel. FIG. 21A shows an additional example of a 2-D tile array and FIG. 21B shows an additional example of a 1-D tile array. An array of display tiles can be a bezel free display. Display tiles can include and/or be electrically connected with front-to-back electrical connections (e.g., wrap-around plated metal, through-substrate vias, through-substrate leads, or a wrap-around flexible connector). A display panel can be flexible. Host screen panel size can be, for example, in a range of 1 to 10 m×0.2 to 4 m (e.g., having a rectangular shape). A host screen panel can include or be made from, for example, glass, film, or web. Tile size can be, for example, between 2 inches and 60 inches on a diagonal. A display tile can include or be made from, for example, glass, ceramic, or an organic. Molding compound, polyimide, or the like can be included in a display tile or used to mount a display tile. A bond surface of a display tile can be fluorinated.

Figure 24:
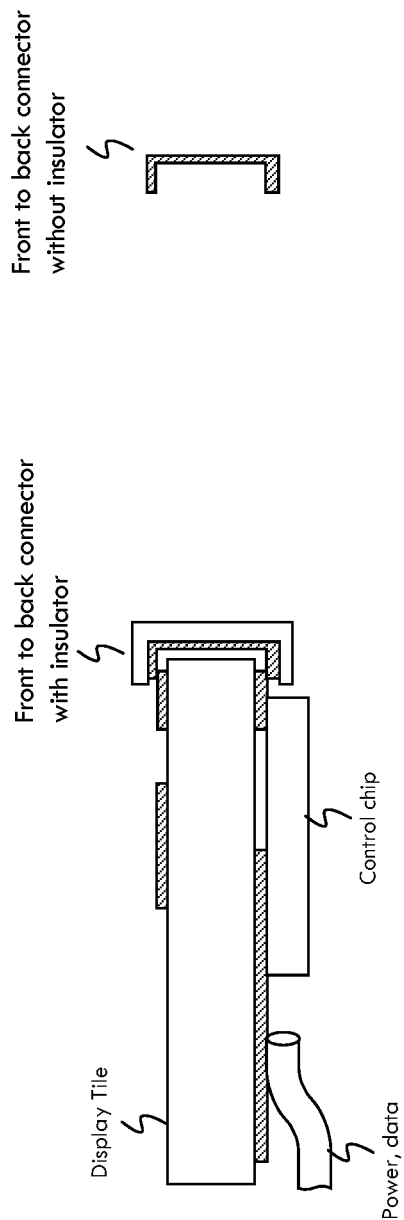
FIG. 24 shows front-to-back (e.g., wrap-around) electrical connections for electrically connecting a display tile, according to some illustrative embodiments of the present disclosure.

FIG. 22 shows an example of a tiled display structure 99 that includes host screen (e.g., screen support 10) and different display tiles 40 with different styles of front-to-back electrical connections (wrap around or through substrate via (e.g., through substrate pillar)) on the host screen. Table 1 describes example specifications of characteristics that can be used in forming a tiled display structure 99 as shown in FIG. 22 (or other tiled display structures 99 disclosed herein). FIG. 23 shows flexible display tiles forming front-to-back electrical connections that can be mounted in an array on a host screen panel (e.g., support screen 10). FIG. 24 shows a display tile that includes a control chip (e.g., pixel controller 56) and a front-to-back electrical connection that is a wrap-around connection (can be used with or without an insulator to electrically isolate the connection). Examples of front-to-back electrical connections include flex circuit (e.g., with copper traces) and weldable wires that connect top surface to bottom surface. Front-to-back electrical connections can be used with a display tile 40 in accordance with FIG. 19, for example.

TABLE 1

| within about 0.1 mm diameter | micro-LEDs and controller Can be located on the surface of the display tile closest to the host screen |

TABLE 1-continued

| | | |
|---|---|---|
| Front-to-back connection | Can be, for example, wrap-around or through-substrate via (e.g., pillar) | Wrap around can benefit from "electrical insulator spacer" to avoid unintentional electrical connection to neighboring display tiles<br>Wrap around plated or printed conductor can be patterned by laser cutting, for example |
| Adhesive | Can be optically clear, optionally with reversible adhesion and cured before joining display tiles to host screen | PDMS elastomer can provide reversible adhesion to many surfaces, e.g. surfaces functionalized with fluorine compounds, for reversible removal of display tiles and re-application of display tiles |
| Adhesive thickness | Optionally about 0.01 to 0.05 mm | Optionally, thin bond line to maximize transmission of light through windows in the host screen |

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the invention should not be limited to the expressly described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps. It should be understood that the order of steps or order for performing certain action is immaterial so long as the disclosed technology remains operable. Moreover, two or more steps or actions in some circumstances can be conducted simultaneously.

PARTS LIST

E edge distance
O opening size
P pixel pitch
10 screen support
12 screen emitter side
14 screen back side
20 black matrix
22 black-matrix material
24 pixel opening
26 color filter
30 adhesive layer
40 tile
42 tile substrate
44 tile emitter side
46 tile back side
48 pigtail
50 pixel
52 light emitter
52R red-light emitter
52G green-light emitter
52B blue-light emitter
54 light-emitter tether
56 pixel controller
58 light-emitter connection posts
60 emitter-side electrode
62 back-side electrode
64 through-via connection
66 wrap-around connection
67 insulator
68 wire bond
70 jumper
72 jumper substrate
74 jumper connection post
76 jumper tether
80 bus connections
82 bezel portion
90 light
99 tiled display structure

The invention claimed is:

1. A tiled display structure, comprising:
a single screen support having a screen emitter side and an opposing screen back side;
a black matrix comprising a patterned layer of black-matrix material disposed on the screen back side, the pattern defining pixel openings that are substantially devoid of black-matrix material;
an array of tiles, each tile comprising a tile substrate and a plurality of pixels disposed in or on the tile substrate, each pixel comprising one or more light emitters, wherein the one or more light emitters are each disposed to emit light through a pixel opening in the black matrix; and
a substantially transparent adhesive layer adhering the tiles to the black-matrix, wherein the single screen support is a display substrate and the black matrix and the single screen support are common for all of the tiles in the array of tiles,
wherein, for each tile of the array of tiles, (i) the tile substrate of the array of tiles has a tile emitter side and a tile back side, (ii) the pixels disposed on the tile substrate are disposed on the tile emitter side, (iii) the tile emitter side is closer to the screen back side than the tile back side, and (iv) the light emitters emit light in a direction opposite to the tile substrate.

2. The tiled display structure of claim 1, wherein each of the one or more light emitters of each pixel of the plurality of pixels is an inorganic light-emitting diode (LED) and the inorganic light-emitting diode comprises a fractured or separated tether.

3. The tiled display structure of claim 1, wherein two or more adjacent tiles in the array of tiles are butted together.

4. The tiled display structure of claim 1, wherein the pixels are disposed at a regular pixel pitch in a direction and wherein the pixel openings have an opening size in the direction that is no greater than one half the pixel pitch.

5. The tiled display structure of claim 1, wherein the pixels are disposed at a regular pixel pitch in a direction and wherein a distance between a pixel at an edge of a tile and the edge of the tile is no greater than one half the pixel pitch.

6. The tiled display structure of claim 1, wherein the tile substrate is flexible.

7. The tiled display structure of claim 1, wherein the tile substrate comprises a pigtail that electrically connects the one or more light emitters to a bus connection.

8. The tiled display structure of claim 1, wherein the tile is a removable or replaceable tile.

9. A tiled display structure, comprising:
a single screen support having a screen emitter side and an opposing screen back side;
a black matrix comprising a patterned layer of black-matrix material disposed on the screen back side, the pattern defining pixel openings that are substantially devoid of black-matrix material;
an array of tiles, each tile comprising a tile substrate and a plurality of pixels disposed in or on the tile substrate, each pixel comprising one or more light emitters, wherein the one or more light emitters are each disposed to emit light through a pixel opening in the black matrix; and
a substantially transparent adhesive layer adhering the tiles to the black-matrix, wherein the single screen support is a display substrate and the black matrix and the single screen support are common for all of the tiles in the array of tiles,
wherein, for each tile of the array of tiles, the tile substrate of the array of tiles has a tile emitter side and a tile back side and wherein the pixels disposed on the tile substrate are disposed on the tile emitter side, and
comprising, for each tile of the array of tiles, (i) emitter-side electrodes disposed on the tile emitter side electrically connected to the pixels, and (ii) back-side electrodes disposed on the tile back side, and (iii) electrical connections electrically connecting the emitter-side electrodes to the back-side electrodes.

10. The tiled display structure of claim 9, wherein the electrical connections are through-via connections that pass through the tile substrate or are wrap-around connections on an edge of the tile that are at least partly disposed on one or more edges of the tile substrate.

11. The tiled display structure of claim 9, wherein each of the tiles comprises a pixel controller disposed on the tile back side, the pixel controller electrically connected to the back-side electrodes, and the pixel controller controlling the one or more light emitters in each of the pixels disposed on the tile substrate.

12. The tiled display structure of claim 9, comprising one or more bus connections and wherein the one or more bus connections are electrically connected to the back-side electrodes of at least one tile.

13. The tiled display structure of claim 12, wherein each of the tiles comprises one or more separate bus connections electrically connected to the back-side electrodes of the tile.

14. The tiled display structure of claim 9, wherein the back-side electrodes of one of the tiles are directly electrically connected to the back-side electrodes of an adjacent tile that is adjacent to the one of the tiles.

15. The tiled display structure of claim 14, wherein the back-side electrodes of the one of the tiles are directly electrically connected to the back-side electrodes of the adjacent tile with one or more of:

a jumper comprising a jumper substrate, connection posts, and a fractured or separated tether;
(ii) one or more wire bonds; and
(iii) one or more wrapped connections.

16. The tiled display structure of claim 14, wherein at least some of the back-side electrodes of a subset of the array of tiles are commonly connected and each of the commonly connected back-side electrodes is electrically connected to a bus connection.

17. The tiled display structure of claim 14, wherein the tiles are disposed in rows and wherein the back-side electrodes of ones of the tiles in a row are electrically connected in common.

18. A tiled display structure, comprising:
a single screen support having a screen emitter side and an opposing screen back side;
a black matrix comprising a patterned layer of black-matrix material disposed on the screen back side, the pattern defining pixel openings that are substantially devoid of black-matrix material;
an array of tiles, each tile comprising a tile substrate and a plurality of pixels disposed in or on the tile substrate, each pixel comprising one or more light emitters, wherein the one or more light emitters are each disposed to emit light through a pixel opening in the black matrix; and
a substantially transparent adhesive layer adhering the tiles to the black-matrix, wherein the single screen support is a display substrate and the black matrix and the single screen support are common for all of the tiles in the array of tiles,
wherein the tile substrate comprises a cable that electrically connects the one or more light emitters to a bus connection.

19. A tiled display structure, comprising:
a single screen support having a screen emitter side and an opposing screen back side;
a black matrix comprising a patterned layer of black-matrix material disposed on the screen back side, the pattern defining pixel openings that are substantially devoid of black-matrix material;
an array of tiles, each tile comprising a tile substrate and a plurality of pixels disposed in or on the tile substrate, each pixel comprising one or more light emitters, wherein the one or more light emitters are each disposed to emit light through a pixel opening in the black matrix; and
a substantially transparent adhesive layer adhering the tiles to the black-matrix, wherein the single screen support is a display substrate and the black matrix and the single screen support are common for all of the tiles in the array of tiles,
wherein the tile substrate is flexible and wherein, for at least one of the tiles, a portion of the tile substrate of the tile is at least partially folded behind a portion of the tile substrate of another one of the tiles that is adjacent to the tile.

20. The tiled display structure of claim 19, wherein the portion of the tile substrate is a bezel portion or a pigtail portion.

* * * * *